United States Patent [19]

Hsieh et al.

[11] Patent Number: 5,389,559
[45] Date of Patent: Feb. 14, 1995

[54] METHOD OF FORMING INTEGRATED INTERCONNECT FOR VERY HIGH DENSITY DRAMS

[75] Inventors: Chang-Ming Hsieh; Louis L. Hsu; Toshio Mii, all of Fishkill; Seiki Ogura; Joseph F. Shepard, both of Hopewell Junction, all of N.Y.

[73] Assignee: International Business Machines Corporation, Armonk, N.Y.

[21] Appl. No.: 161,763

[22] Filed: Dec. 2, 1993

[51] Int. Cl.⁶ .................... H01L 21/70; H01L 27/00
[52] U.S. Cl. ............................. 437/52; 437/60; 437/919
[58] Field of Search ................... 437/32, 47–48, 437/60, 919

[56] References Cited

U.S. PATENT DOCUMENTS

| | | | |
|---|---|---|---|
| 4,717,689 | 1/1988 | Mass et al. | 437/225 |
| 4,859,622 | 8/1989 | Eguchi | 437/47 |
| 4,881,105 | 11/1989 | Davari et al. | 357/23.4 |
| 5,008,214 | 4/1991 | Redwine | 437/52 |
| 5,013,680 | 5/1991 | Lowrey et al. | 437/52 |
| 5,049,518 | 9/1991 | Fuse | 437/52 |
| 5,064,776 | 11/1991 | Roberts | 437/41 |
| 5,065,273 | 11/1991 | Rajeevakumar | 361/313 |
| 5,156,992 | 10/1992 | Teng et al. | 437/52 |
| 5,173,439 | 12/1992 | Dash et al. | 437/67 |
| 5,182,224 | 1/1993 | Kim et al. | 437/52 |
| 5,183,774 | 2/1993 | Satoh | 437/52 |
| 5,198,995 | 3/1993 | Dennard et al. | 365/149 |
| 5,225,363 | 7/1993 | Riemenschneider et al. | 437/52 |
| 5,244,824 | 9/1993 | Sivan | 437/52 |

FOREIGN PATENT DOCUMENTS 3931391A 3/1991 Germany.

OTHER PUBLICATIONS

M. Sakao, et al., "A Capacitor-Over-Bit-Line (COB) Cell with a Hemispherical-Grain Storage Node for 64Mb DRAMs" IEEE, pp. 27.3.1–27.3.4 1990.

*Primary Examiner*—George Fourson
*Assistant Examiner*—H. Jey Tsai
*Attorney, Agent, or Firm*—Charles W. Peterson, Jr.

[57] ABSTRACT

A trench capacitor DRAM cell with Shallow Trench Isolation (STI), a self-aligned buried strap and the method of making the cell. A trench capacitor is defined in a substrate. The trench capacitor's polysilicon (poly) plate is recessed below the surface of the substrate and the trench sidewalls are exposed above the poly. A doped poly layer is deposited over the surface contacting both the sidewall and the trench capacitor's poly plate. Horizontal portions of the poly layer are removed either through chemmech polishing or Reactive Ion Etching (RIE). A shallow trench is formed, removing one formerly exposed trench sidewall and a portion of the trench capacitor's poly plate in order to isolate the DRAM cell from adjacent cells. The remaining poly strap, along the trench sidewall contacting the poly plate, is self aligned to contact the source of the DRAM Pass gate Field Effect Transistor (FET). After the shallow trench is filled with oxide, FET's are formed on the substrate, completing the cell. In an alternate embodiment, instead of recessing the poly plate, a shallow trench is formed spanning the entire width of the trench capacitor. The deposited polysilicon is selectively removed, having straps that strap the poly plate to the shallow trench sidewall.

28 Claims, 6 Drawing Sheets

METHOD OF FORMING INTEGRATED INTERCONNECT FOR VERY HIGH DENSITY DRAMS

FIELD OF THE INVENTION

The present invention relates generally to a semiconductor memory, and more particularly to a method of fabricating a Dynamic Random Access Memory (DRAM).

BACKGROUND OF THE INVENTION

Dynamic Random Access Memory (DRAM) cells are well known. A DRAM cell is essentially a capacitor for storing charge and a pass transistor (also called a pass gate) for transferring charge to and from the capacitor. Because cell size determines chip density, size and cost, reducing cell area is the DRAM designer's primary goal. Reducing cell area is done, normally, by reducing feature size to shrink the cell.

Besides shrinking the cell, the most effective way to reduce cell area is to reduce the largest feature in the cell, typically, the area of the storage capacitor. Unfortunately, shrinking the capacitor area reduces capacitance and, consequently, reduces stored charge. Reduced charge means what is stored in the DRAM is more susceptible to noise, soft errors, leakage and other typical DRAM problems. Consequently, a DRAM cell designer's goal is to maintain storage capacitance without sacrificing cell area.

One way to accomplish this goal for high density DRAMs is to use trench capacitors in the cell. Trench Capacitors are formed by placing the capacitor on its side, in a trench, and are vertical with respect to the chip's surface. Thus, the space required for the storage capacitor is dramatically reduced without sacrificing capacitance, and more importantly, stored charge.

FIG. 1 is an example of prior art trench capacitor DRAM cells and FIG. 2 is a cross sectional view of the DRAM cells of FIG. 1. Each cell 100 is isolated from other cells 100 by a deep trench 102. A polysilicon layer 104 in the trench 102 encircles each cell 100 and is the storage plate of the cell's storage capacitor. A layer of oxide 106 separates each storage plate 104 from a layer of polysilicon 108 (poly) separating cells 100 and forming the storage capacitors' reference plate. A buried polysilicon contact 110 is formed after the pass gate, a Field Effect Transistor (FET), is defined. The contact 110 provides the pass gate's source and straps the FET's source to the poly storage plate 104. A polysilicon word line 112 forms the FET's gate, with its drain 114 connected to bit line contact 116. Thus, as can be seen from the above example, using a trench capacitor eliminates much of the cell area, i.e. cell area formerly reserved for the storage capacitor. However, forming the strap between the pass gate and the capacitor is a delicate operation.

One approach to making this strap, i.e. between the cell's storage plate and the cell's pass gate is disclosed in U.S. Pat. No. 5,049,518 to Fuse entitled "Method of Making a Trench DRAM Cell", incorporated herein by reference. Fuse discloses a DRAM cell with a trench storage capacitor wherein the storage capacitor is connected to the pass gate by using a fine trench polysilicon burying method or by using a selective epitaxial method. After the gate is formed in the Fuse method, a fine trench is formed along the deep trench edge, between the pass gate's source/drain and the trench storage capacitor's polysilicon storage plate. The fine trench is filled with polysilicon to form the strap between the storage plate and the existing pass gate source/drain. Consistently, strapping the trench capacitor to the pass gate according to the Fuse method is difficult, because the fine trench (defined by the overlay of a photoresist opening with the edge of the trench) must be kept thin enough, so that the DRAM cell size does not increase, but, still, wide enough and deep enough that polysilicon can be deposited in the opening to contact the polysilicon capacitor electrode. By eliminating storage surface capacitor area as a major factor in cell area, cell feature size, already a primary factor in cell area, again became the focus in DRAM cell design.

However, as features shrink, it becomes increasingly difficult to strap the storage capacitor to the transfer gate. Further, reliability of this connection drops, reducing chip yield. Another reason it is difficult to form the strap is because, it is formed after the gate. Once the gate is formed, the wafer's surface is not smooth. Instead, the surface is filled with relatively large peaks and valleys resulting from prior transistor definition steps. This uneven topography makes it more difficult to focus on alignment targets and much more difficult to align upper layers with layers defined much earlier, when the wafer was still smooth and buried under this uneven topography.

Finally, etching required to open the fine trench attacks oxide protecting the pass gate, introducing gate defects. For example, plasma etching can result in damage to gate oxide from high energy ion bombardment.

PURPOSES OF THE INVENTION

It is a purpose of the invention to improve manufacturability of dense DRAM chips.

It is another purpose of the present invention to simplify DRAM cell formation.

It is still another purpose of the present invention to improve manufacturability of trench capacitor DRAM cells.

It is still another purpose of the present invention to simplify reliably strapping the storage plate to the pass gate of a trench DRAM cell.

SUMMARY OF THE INVENTION

The present invention is a Dynamic Random Access Memory (DRAM), DRAM cell and the method of forming the DRAM cell. The cell is a transfer gate connected between a bit line and a trench storage capacitor, the trench capacitor formed in a deep trench is strapped by a self-aligned buried strap to the pass gate by: forming a trench capacitor in a silicon substrate; depositing a layer of doped polysilicon or other conductive material over the substrate; selectively removing the polysilicon layer from the substrate; etching a shallow trench into the substrate, the shallow trench encompassing at least part of the trench capacitor; filling the shallow trench with oxide; and forming pass gates on the substrate and strapping the pass gate to trench capacitors by remaining portions of the polysilicon layer. In one embodiment, the trench capacitor is recessed before the polysilicon layer is deposited. In another embodiment, the shallow trench is formed before the polysilicon layer is deposited and the shallow trench spans the entire width of the deep trench.

DESCRIPTION OF THE PREFERRED EMBODIMENTS

Figure 1:
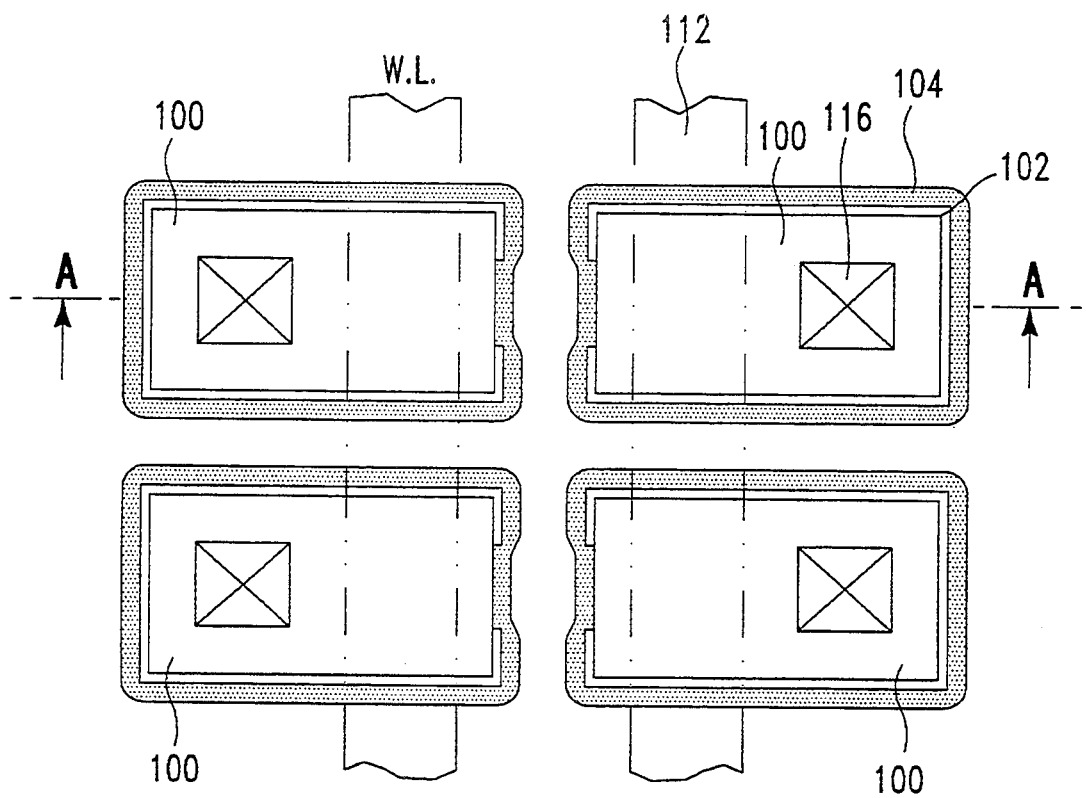
FIG. 1 is a layout of a prior art trench capacitor DRAM cell.
Figure 2:
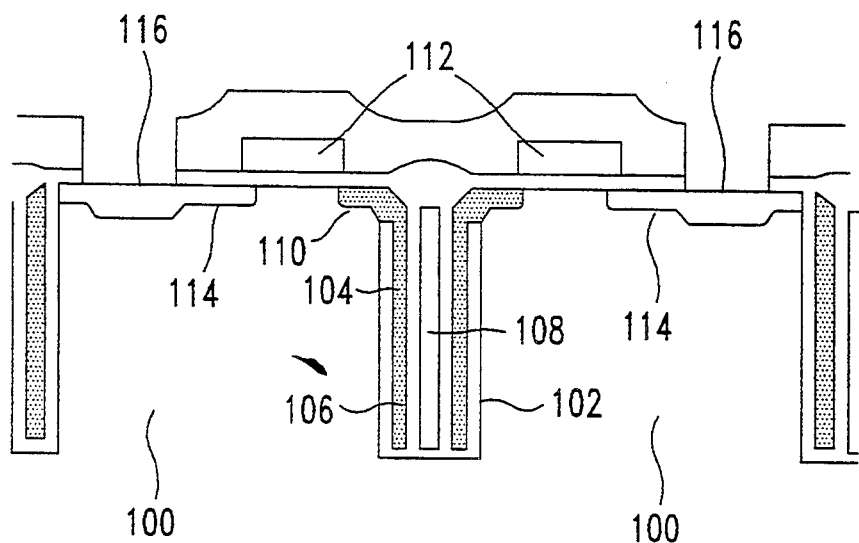
FIG. 2 is a cross-sectional representation of the DRAM cell of FIG. 1 through A—A.
Figure 3:
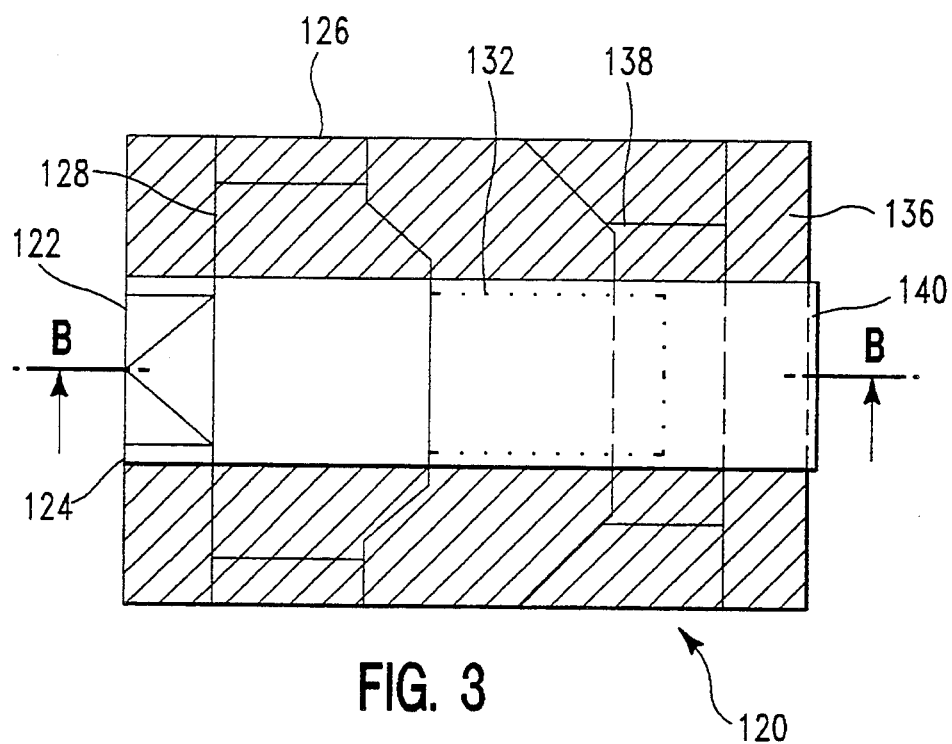
FIG. 3 is a layout of a DRAM cell according to one preferred embodiment of the present invention.
Figure 4:
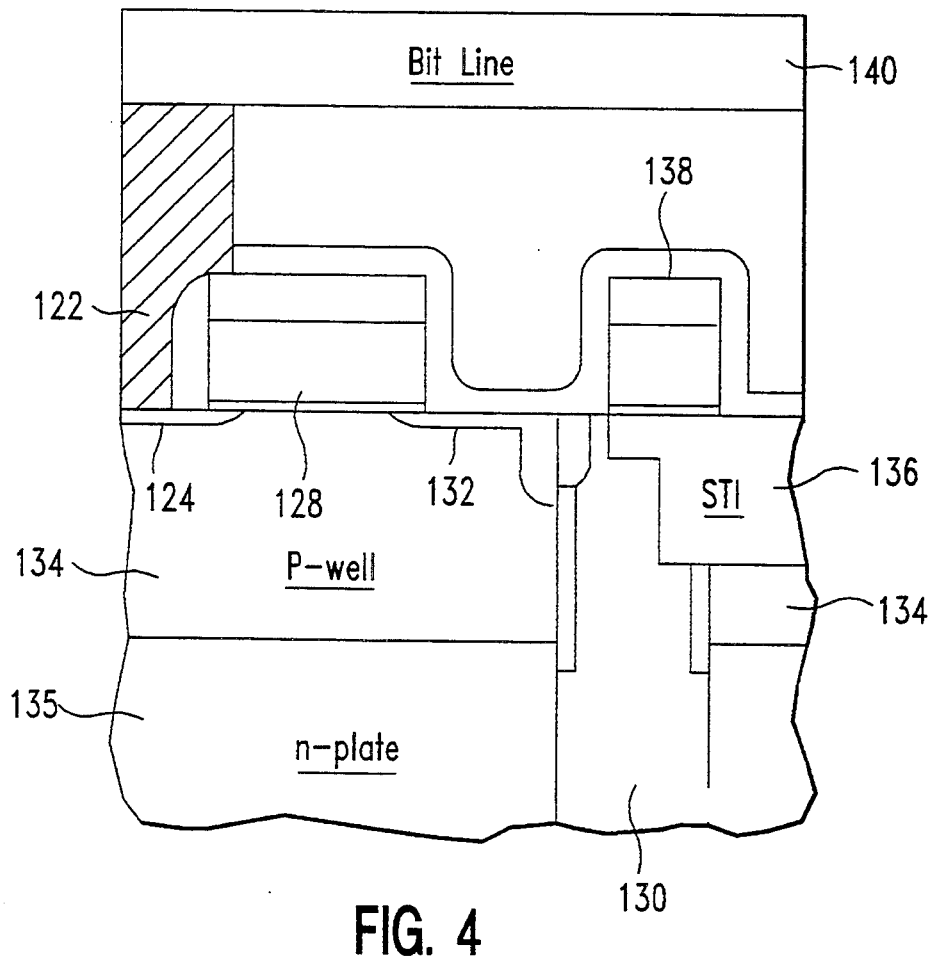
FIG. 4 is a cross section of the DRAM cell of FIG. 3 through B—B.

FIG. 3 represents a single Dynamic Random Access Memory (DRAM) cell in a DRAM array according to a preferred embodiment of the present invention. The array may be an integrated circuit chip, or a portion or a collection thereof. FIG. 4 represents a cross-sectional view of the cell of FIG. 3 through B—B. The cell 120 shares a bit line contact 122 and its drain diffusion 124, with an adjacent cell to its left (not shown). One of the array's word lines 126 forms the pass gate 128. The storage plate 130 of the storage capacitor is strapped by a self-aligned buried strap the pass gate's source 132, with the capacitor's opposite plate formed partially by the p-well 134 and partially by the substrate 135. A shallow trench 136 isolates the cell 120 from an adjacent cell to its right (not shown). A second array word line 138 runs vertically, passing over the trench capacitor 130 and partially over the Shallow Trench Isolation (STI) region 136, forming pass gates for adjacent cells above and below (not shown). The cell's bit line 140 runs horizontally connecting the cell's bit line contact 122 to other cells' bit line contacts to the right and left. All cells in the array have an identical layout and are either mirror images, rotated about the cell's origin, usually by 180°, or merely copied.

Figure 5A:
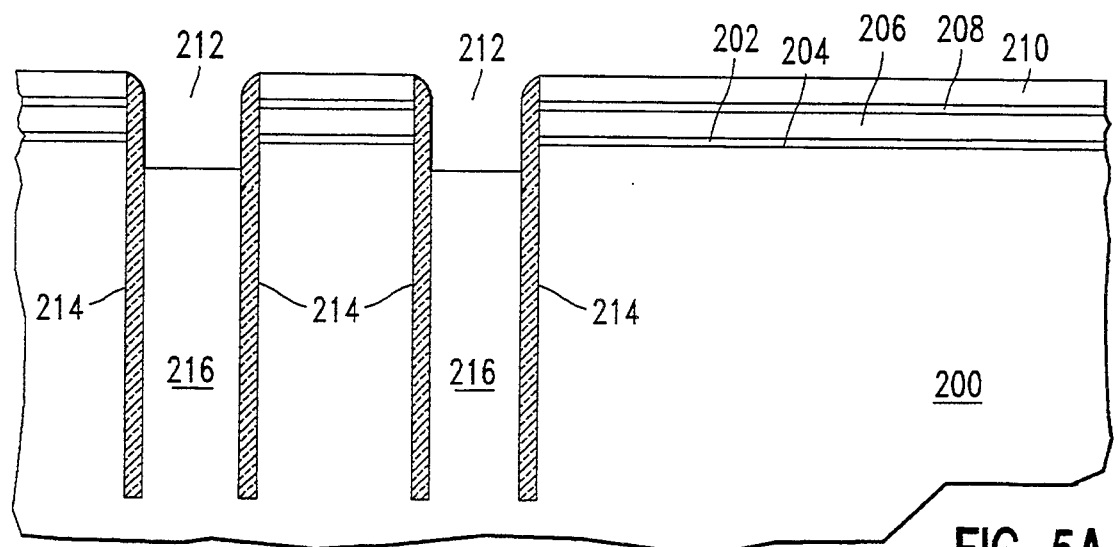
FIGS. 5A–F represents the steps followed in fabricating the pass gate-capacitor strap of the DRAM cell of FIG. 3.

The DRAM cell of FIG. 3 is fabricated according to a first preferred embodiment as represented in FIGS. 5A–F. FIG. 5A, shows the substrate after the trench capacitor is formed. The wafer 200 is prepared by thermally growing a first thin (150 Å) oxide layer 202 on the wafer's surface 204. An 800 Å layer of $SiO_2$ 206 is deposited using Chemical Vapor Deposition (CVD) on the first thin oxide layer 202. A thin CVD polysilicon layer 208 is deposited on CVD oxide layer 206. The thin polysilicon layer 208 is covered by a 1500 Å CVD nitride layer 210. Deep trenches 212, 2–10 μm, are etched into the wafer 200 for the cells' storage capacitors. A thin $SiO_2$ collar layer 214 is grown in the deep trenches 212 which are then filled with polysilicon (poly) 216. Once the trenches 212 are filled with poly 216, the poly 216 is etched such that it is recessed beneath the wafer's surface 204 by 1500 Å.

Figure 5B:
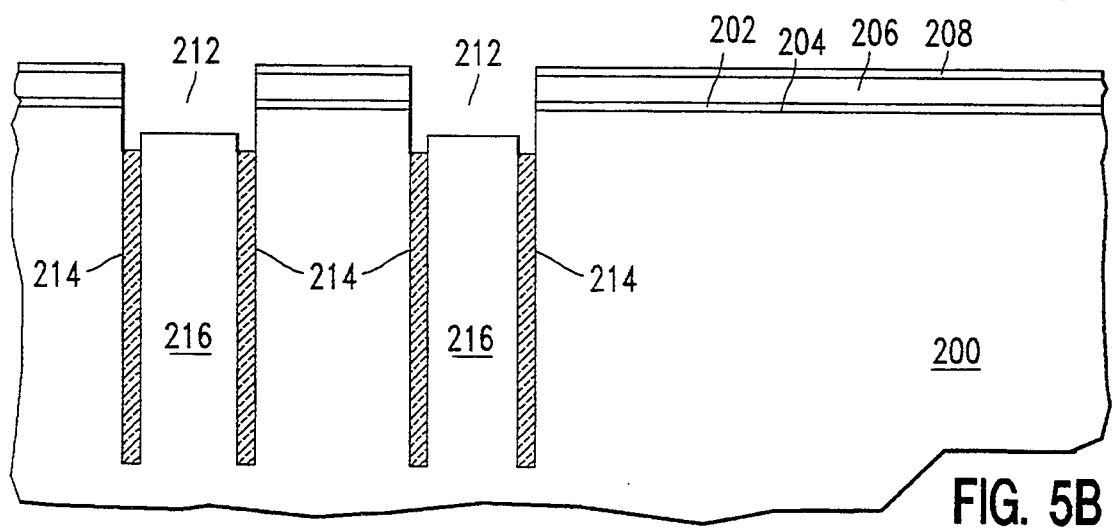
Figure 5C:
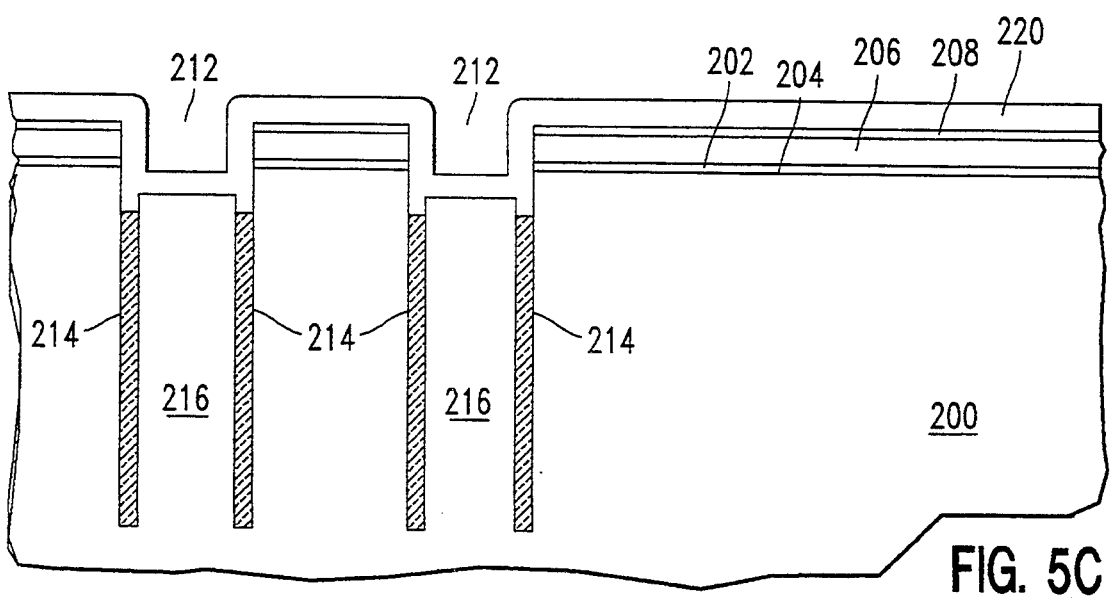
Figure 5D:
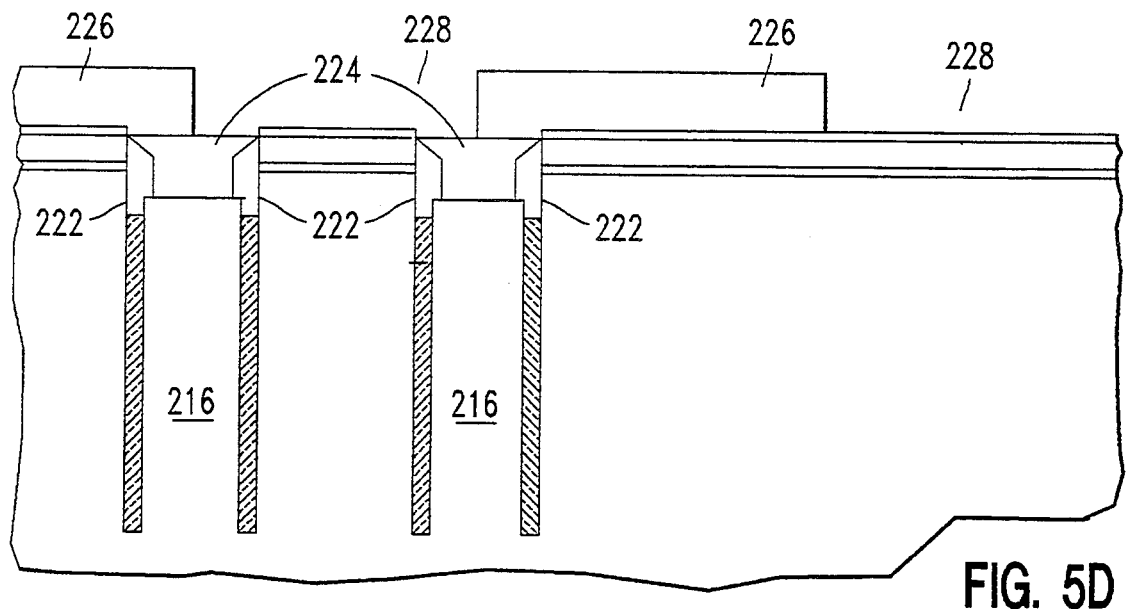
Figure 5E:
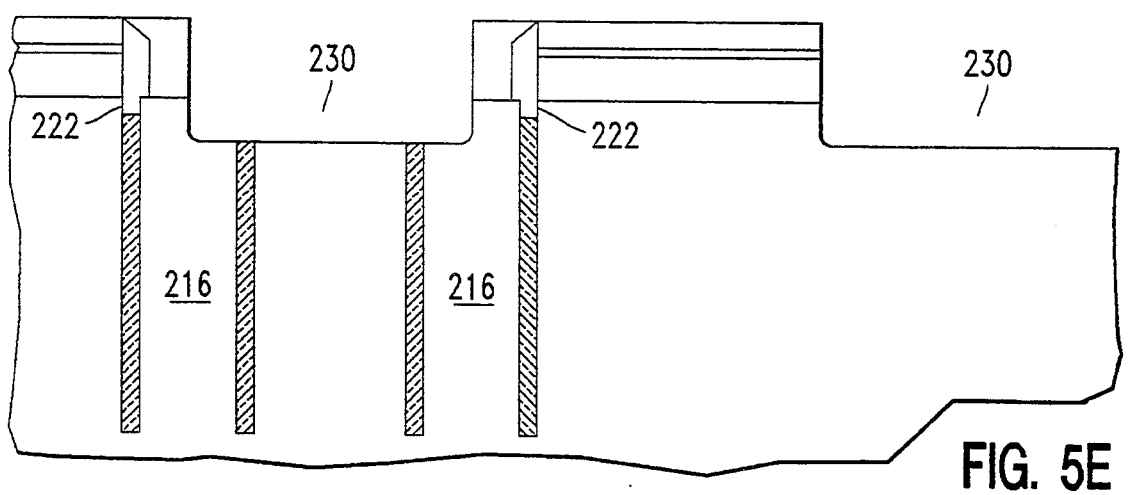
Figure 5F:
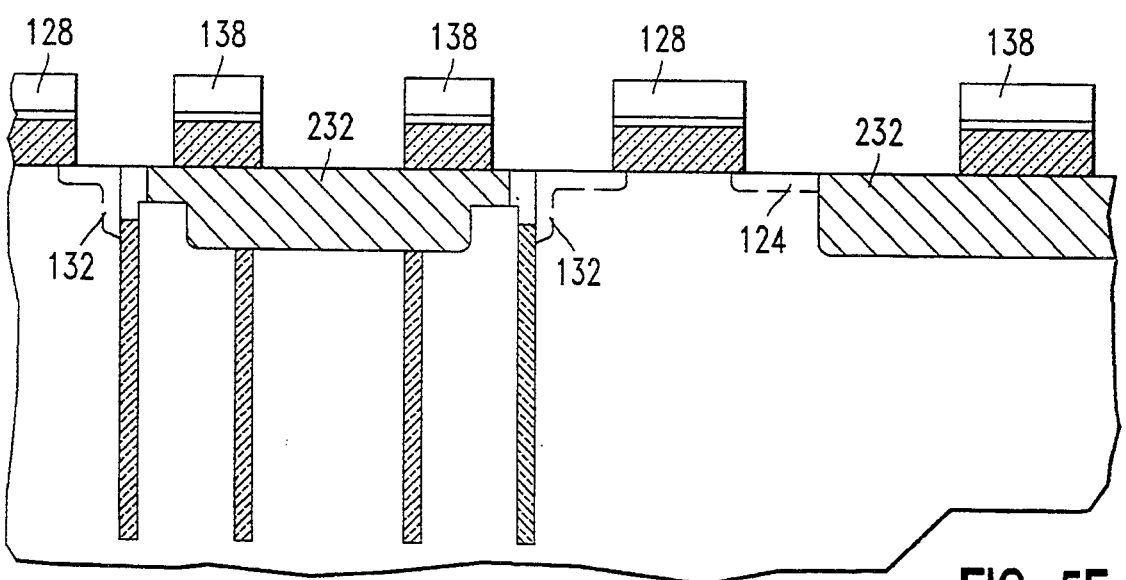

Next, in FIG. 5B, the surface nitride layer 210 is removed as the exposed area of the $SiO_2$ collar 214 is etched back. In FIG. 5C, a layer 220 of doped poly (alternatively any suitable conductive material such as Ge or amorphous Si may be substituted) is deposited on the wafer 200 of FIG. 5B. The doped poly layer 220 is selectively etched back from the surface leaving poly strap 222 only along the trench sidewalls. In an alternate embodiment of the present invention, the doped conductive material layer 220 is etched such that the straps 222 are recessed beneath the wafer surface to bury the straps 222 completely. In still another embodiment, the poly layer 220 is chem-mech polished, leaving the poly layer in the recessed trench. After removing the poly layer 220 from the surface, the recessed trenches 212 are refilled with oxide 224, covering the formerly exposed poly 216 and the straps 222. Alternatively, refilling the trench with oxide 224 may be omitted. STI regions 228 are defined with photoresist 226 and etched through the oxide (and doped poly for the chemmech embodiment) into the trench capacitor poly plate 216 as in FIG. 5E. After the shallow trench 230 is defined, the photoresist and the thin poly layer 208 are removed. The shallow trench areas 230 are filled with oxide 232 and planarized by chem-mech-polish or etch back. The pass gates are defined and the memory cell fabrication is completed using conventional processing steps thereafter to result in the structure of FIG. 5F.

Figure 6A:
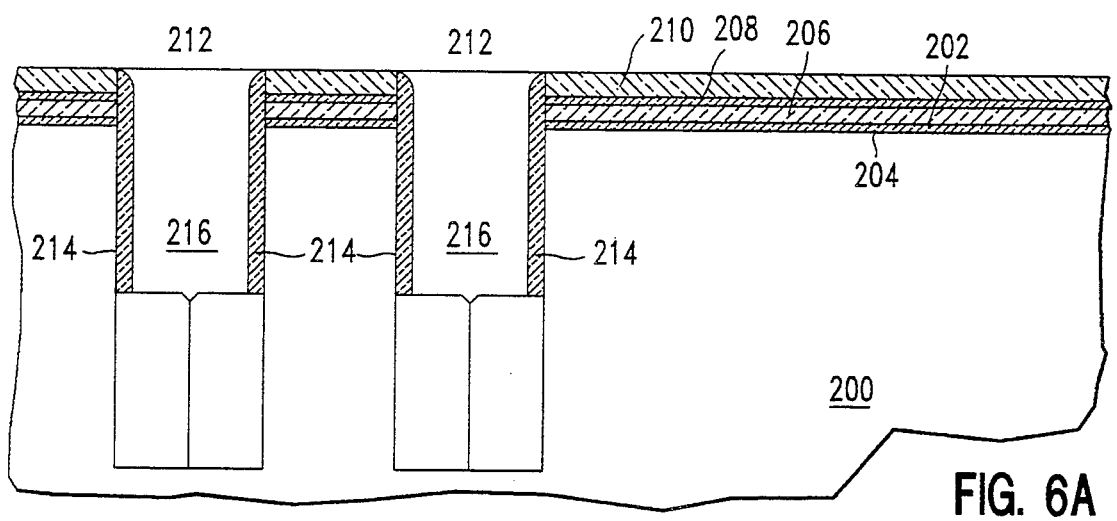
FIGS. 6A–F is an alternate embodiment method for forming a DRAM cell pass gate-capacitor strap.
Figure 6B:
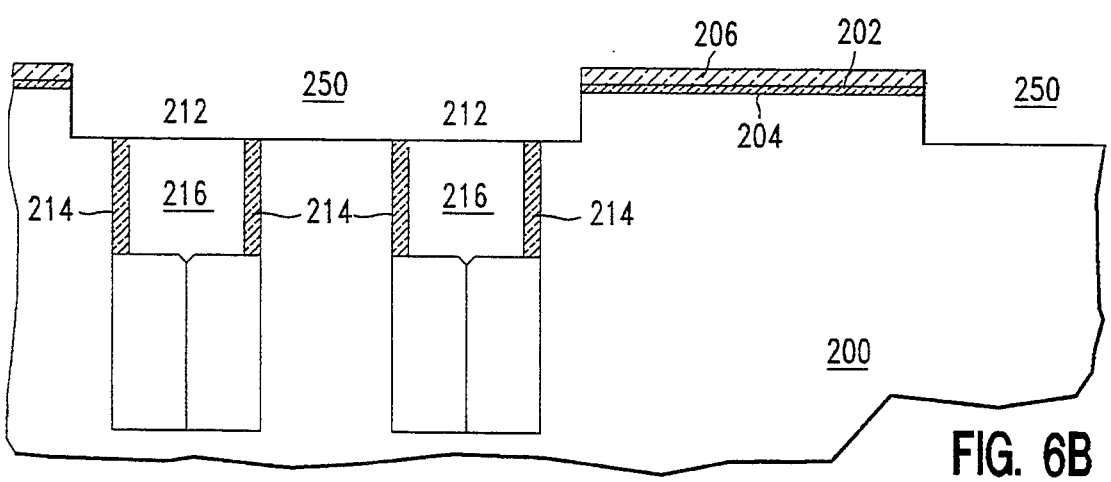
Figure 6C:
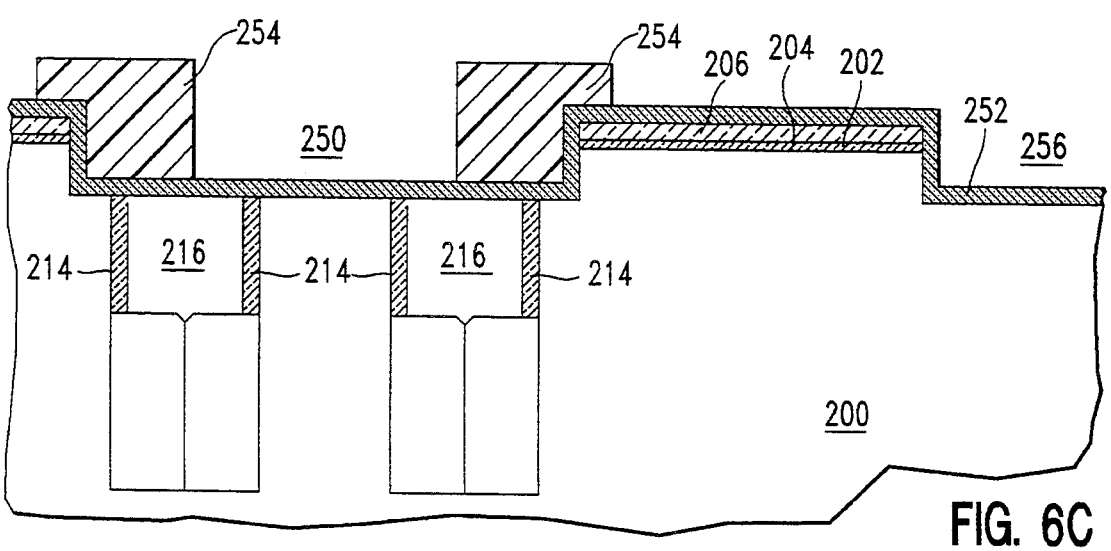
Figure 6D:
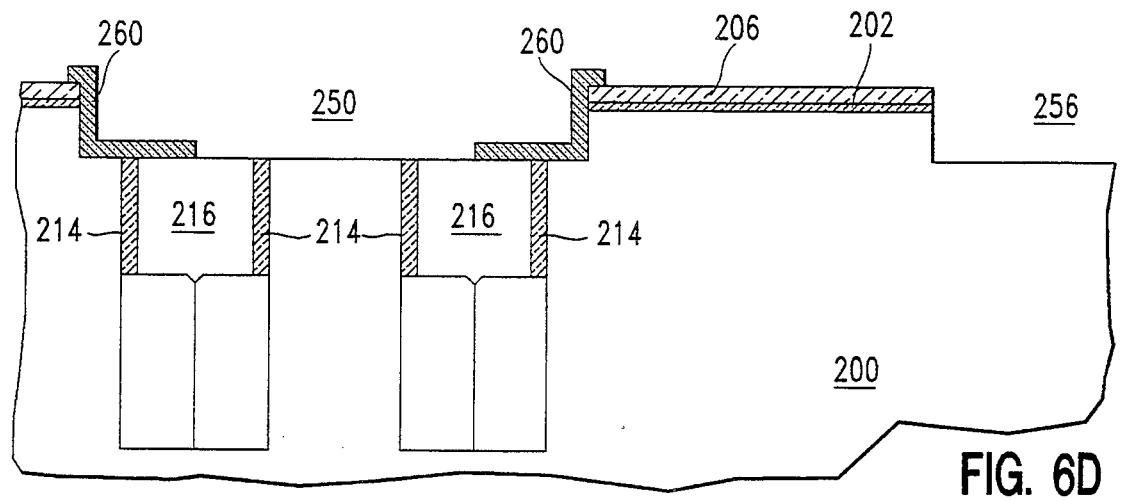
Figure 6E:
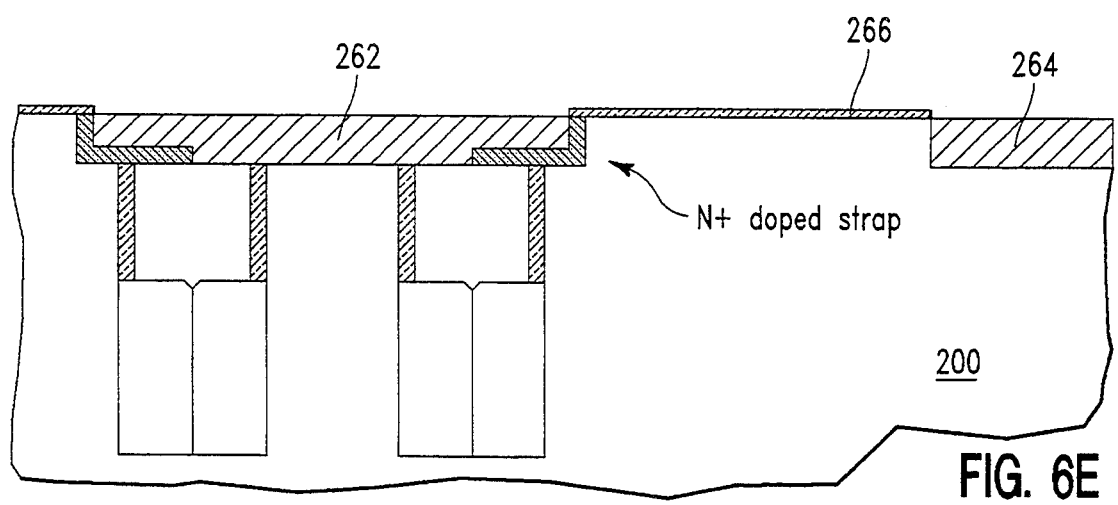
Figure 6F:
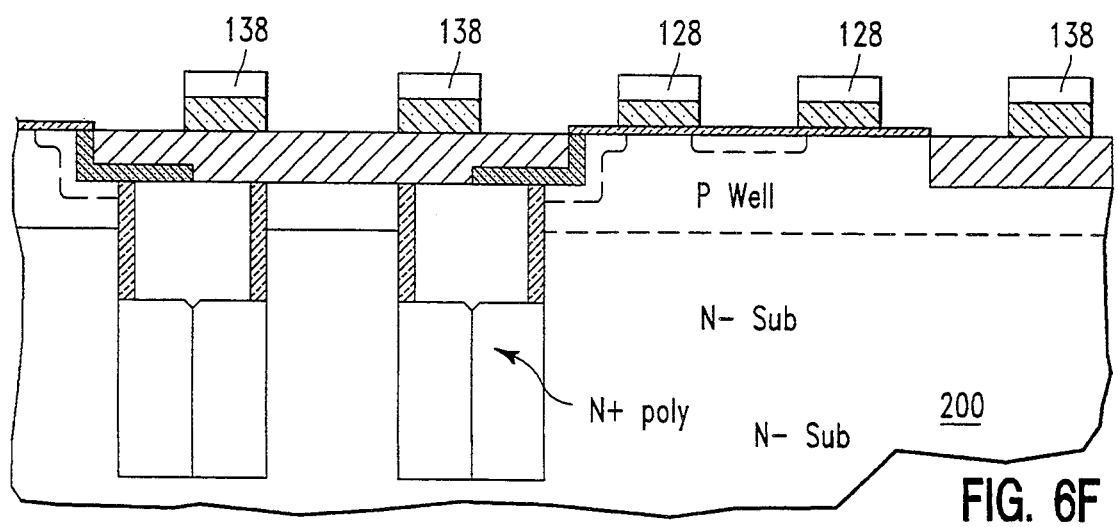

A second preferred embodiment of the present invention is provided in FIGS. 6A–F. In the second preferred embodiment, the wafer 200 is prepared substantially as in FIG. 5A. The poly 216 is recessed into the trench by Reactive Ion Etch (RIE) to about 1500 Å below the wafer surface 204. Subsequently, the nitride sidewall 214 is etched back approximately 6000 Å, completely removing surface nitride layer 210. Then the polysilicon 216 and a portion of silicon substrate 219 are further etched back to approximately the same level as the remaining nitride sidewall 214 resulting in the shallow trenches 250 of the structure of FIG. 6B. As shown in FIG. 6C, a layer of doped poly 252 (alternatively this could be Ge, amorphous Si or any suitable doped conductive material) is deposited on the structure of FIG. 6B. In this preferred embodiment, the layer of doped poly is a 1000 Å thick layer of n+ doped poly. Straps are defined in the doped poly layer 252 with a bilayer resist pattern 254. The poly layer 252 is isotopically etched using a plasma etch such that no residual sidewall 260 is left unintentionally in shallow trench areas, i.e., straps 260 are left on the trench sidewalls only where defined by photoresist as in FIG. 6D. The shallow trenches 250, 256 are coated with thermal oxide and then filled with CVD oxide 262, 264 as shown in FIG. 6E. After oxide deposition in forming the structure of FIG. 6E, CVD Tetraethoxisilane (TEOS) is deposited. Then the surface is chem-mech polished to remove surface poly and planarize the structure. Chem-mech polishing is followed by stress relief annealing to reduce stress created during chem-mech polishing. Finally, pad oxide 204 and 206 is removed and gate oxide is regrown 266, in FIG. 6. The pass gates and poly word lines 128, 138 are formed using a conventional method.

While the present invention has been described herein in terms of preferred embodiments, numerous modifications and variations will occur to a person having ordinary skill in the art without departing from the spirit and scope of the present invention. It is intended that the appended claims encompass those modifications and variations.

We claim:

1. A method of forming a DRAM cell, said cell having a pass gate connected between a bit line and a storage capacitor, said storage capacitor being a trench capacitor, said method comprising the steps of:
   a) forming a trench capacitor in a first trench in a surface of a semiconductor body;

b) depositing a layer of doped semiconductor material over said trench capacitor and said surface;

c) selectively removing said deposited doped semiconductor material layer from said surface, remaining said doped semiconductor material forming straps between said trench capacitor and said surface; then, d) etching an isolation trench into said surface, said isolation trench being wider than said first trench, extending horizontally along said first trench and spanning one side of said first trench;

e) filling said isolation trench with oxide; and f) forming a past gate on said surface adjacent said first trench, one of said straps connecting said pass gate to said capacitor.

2. The method of claim 1 further comprising before the step (b) of depositing the layer of doped semiconductor material the step:

a1) recessing said trench capacitor below said surface.

3. The method of claim 2 wherein said semiconductor body is a silicon wafer and the step (a) of forming the trench capacitor comprises the steps of:
1) forming a multilayered dielectric on said surface;
2) etching said first trench through said multilayered dielectric and into said silicon wafer;
3) coating said first trench with said dielectric material; and,
4) depositing doped polysilicon in said first trench, said deposited polysilicon filling said first trench.

4. The method of claim 3 wherein said step (a1) of recessing said trench capacitor recesses said deposited polysilicon and exposes said dielectric material along sidewalls of said first trench, said method further comprising, before the step (b) of depositing the layer of doped semiconductor material, the step of:

a2) etching away said exposed dielectric material and a portion of said dielectric material between said sidewall and said recessed polysilicon.

5. The method of claim 4 wherein said doped semiconductor material is doped polysilicon and the step (c) of selectively removing said doped semiconductor material layer comprises etching said semiconductor material until straps are formed along the sidewalls of the trench.

6. The method of claim 5 wherein said doped polysilicon layer is etched until said straps remain along said sidewall and extend upward from said capacitor, whereby said straps are completely buried beneath oxide formed in filling step (e).

7. The method of claim 1 wherein the layer of doped semiconductor material is a layer of doped polysilicon and the step (c) of removing said layer of doped semiconductor material comprises chem-mech polishing surface.

8. The method of claim 5 wherein the etching step (d) comprises:
1) filling said recessed first trench with a dielectric material; and
2) etching said isolation trench.

9. The method of claim 1 wherein said doped semiconductor material layer is a Ge layer and the step (c) of selectively removing said doped semiconductor material layer comprises etching said Ge layer such that straps are formed from the Ge layer along as portion of the sidewalls of the first trench.

10. The method of claim 1 wherein said doped semiconductor material layers is an amorphous Si layer and the step (c) of selectively removing said doped semiconductor material layer comprises etching said amorphous Si layer such that straps are formed from the amorphous Si layer along a portion of the sidewalls of the first trench.

11. The method of claim 1 wherein said doped semiconductor material is n-type material and said pass gates are n-type FET's.

12. The method of claim 1 wherein the step (d) of etching the isolation trench is done before the step (b) of depositing the layer of doped semiconductor material.

13. The method of step 12 wherein the isolation trench extends horizontally beyond both sides of said first trench.

14. The method of claim 13 wherein the step (c) of selectively removing the doped semiconductor material layer comprises selectively removing said doped semiconductor material layer from said isolation trench such that said straps remain on at least one sidewall of each said isolation trench and extend laterally to the trench capacitor.

15. The method of claim 14 wherein said pass gates are n-type FET's.

16. The method of claim 15 wherein said doped semiconductor material layer is a layer of n-doped polysilicon.

17. The method of claim 15 wherein said doped semiconductor material layer is a layer of Ge.

18. The method of claim 15 wherein said doped semiconductor material layer is a layer of amorphous Si.

19. The method of claim 1 wherein said isolation trench is etched to 2500 Å below said surface.

20. The method of claim 2 wherein the trench capacitor is recessed beneath said surface by 1500 Å.

21. A method of forming a DRAM cell in an array of said cells, each of said cells having a pass gate connected between a bit line and a storage capacitor, said storage capacitor being a trench capacitor, said method comprising the steps of:

a) forming a doped polysilicon trench capacitor in a first trench in a surface of a silicon substrate;

b) recessing said doped polysilicon trench capacitor below said surface;

c) depositing a layer of doped trench over said doped polysilicon trench capacitor and said surface;

d) selectively removing said doped polysilicon layer from said surface, remaining said doped polysilicon layer forming straps between said doped polysilicon trench capacitor and said surfaces; then, e) etching an isolation trench into said surface, said isolation trench being wider than said first trench and extending horizontally along said first trench and spanning one side of said first trench;

f) filling said isolation trench with oxide; and g) forming an FET on said surface adjacent said first trench, said FET being a pass gate, said pass gate being strapped to said polysilicon trench capacitor by one of said straps.

22. The method of claim 21 wherein said semiconductor body is a silicon wafer and the step (a) of forming the trench capacitor comprises the steps of:
1) forming a multilayered dielectric on said surface;
2) etching first trenches through said multilayered dielectric and into said silicon;
3) coating said first trenches with dielectric material; and,
4) deposited doped polysilicon in said trenches, said deposited polysilicon filling said trenches.

23. The method of claim 22 wherein said recessing step (b) exposes said dielectric material along sidewalls of said first trenches, said method further comprising, before the step (c) of depositing the layer of doped polysilicon, the step of:
   b1) etching away said exposed dielectric material and a portion of said dielectric material between said sidewalls and said recessed polysilicon.

24. The method of claim 23 wherein the step (d) of removing said doped polysilicon layers comprises etching said doped polysilicon layer until straps are formed along the trench sidewalls.

25. The method of claim 21 wherein the step (d) of selectively removing said doped polysilicon layer comprises chem-mech polishing the surface.

26. The method of claim 24 wherein the etching step (e) comprises:
   1) filling said recessed first trench with dielectric material; and
   2) etching said isolation trench 27. A method of forming an array of DRAM cells, each said cell having a pass gate connected between a bit line and a storage capacitor, said storage capacitor being a trench capacitor, said method comprising the steps of:

a) forming a plurality of doped polysilicon trench capacitors in a plurality of first trenches in a surface of a silicon substrate;
   b) etching an isolation trench into said surface said isolation trench being wider than said first trench and extending horizontally along said first trench and spanning at least two of said first trench;
   c) depositing a layer of doped polysilicon over said plurality of said doped polysilicon trench capacitors and on said surface;
   d) selectively removing said doped polysilicon layer from said surface, remaining said doped polysilicon layer forming straps between said plurality of doped polysilicon trench capacitors and said surface;
   e) filling each said isolation trench with oxide; and
   f) forming an FET pass gate on said surface adjacent each said doped polysilicon trench capacitor, each said strap connecting one of said FET pass gates to one said doped polysilicon trench capacitor.

28. The method of claim 27 wherein after the step (d) of selectively removing the doped polysilicon layer from the surface each said strap remains on at least one sidewall of each said isolation trench and extends laterally to the doped polysilicon trench capacitor.

* * * * *